United States Patent [19]

Grenie et al.

[11] Patent Number: 5,356,727
[45] Date of Patent: Oct. 18, 1994

[54] CARBONACEOUS MATERIAL PROTECTED AGAINST OXIDATION BY BORON CARBONITRIDE

[75] Inventors: Yves Grenie; André Marchand, both of Merignac; Frédéric Saugnac, Talence, all of France

[73] Assignee: Aerospatiale Societe Nationale Industrielle, France

[21] Appl. No.: 870,800

[22] Filed: Apr. 17, 1992

Related U.S. Application Data

[63] Continuation of Ser. No. 556,846, Jul. 20, 1990, abandoned.

Foreign Application Priority Data

Jul. 21, 1989 [FR] France ............... 89 09872

[51] Int. Cl.$^5$ .................. B32B 18/00; B64G 1/58
[52] U.S. Cl. .................. 428/698; 428/366; 428/367; 428/426; 428/432; 428/697; 428/699; 428/701; 428/704
[58] Field of Search ............... 428/408, 366, 367, 698, 428/704, 701, 697, 699, 426, 432

[56] References Cited

U.S. PATENT DOCUMENTS

| | | | |
|---|---|---|---|
| 3,672,936 | 6/1972 | Ehrenreich | 428/408 |
| 3,771,976 | 11/1973 | Wakefield | 428/698 |
| 3,859,160 | 1/1975 | Marin | 428/408 |
| 3,914,508 | 10/1975 | Hooton et al. | 428/408 |
| 4,049,783 | 9/1977 | Vereschagin et al. | 423/446 |
| 4,164,601 | 8/1979 | Shaffer | 428/408 |
| 4,187,083 | 2/1980 | Wedlake et al. | 423/276 |
| 4,397,901 | 8/1983 | Warren | 428/408 |
| 4,500,602 | 2/1985 | Patten et al. | 428/367 |
| 4,515,860 | 5/1985 | Holzl | 428/366 |
| 4,559,256 | 7/1986 | Vasilos | 428/408 |
| 4,582,751 | 4/1986 | Vasilos | 428/408 |
| 4,599,281 | 7/1986 | Schintlmeister et al. | 428/701 |
| 4,642,271 | 2/1987 | Rice | 428/367 |
| 4,668,579 | 5/1987 | Strangman et al. | 428/408 |
| 4,731,303 | 3/1988 | Hirano et al. | 428/698 |
| 4,734,339 | 3/1988 | Schachner et al. | 428/698 |
| 4,795,677 | 1/1989 | Gray | 428/408 |
| 4,859,503 | 8/1989 | Bouix et al. | 428/367 |
| 4,863,773 | 9/1989 | Rousseau et al. | 428/408 |
| 4,868,056 | 9/1989 | Haskorn | 428/408 |
| 4,892,790 | 1/1990 | Gray | 428/408 |
| 4,894,286 | 1/1990 | Gray | 428/697 |

FOREIGN PATENT DOCUMENTS

| | | | |
|---|---|---|---|
| 0282386 | 2/1988 | European Pat. Off. | C04B 35/52 |
| 2600631 | 1/1976 | Fed. Rep. of Germany | C04B 41/06 |
| 1222837 | 1/1960 | France | C04B 41/50 |
| 2075095 | 12/1970 | France | C01B 31/00 |
| 59-16968 | 1/1984 | Japan | C23C 11/08 |

OTHER PUBLICATIONS

Saugnac et al. "Characterisation of C-B-N Solid Solutions Deposited from a Gaseous Phase between 900° and 1050° C." Journ. of Amer. Ceram. Soc. vol. 75 No. 1 Jan. 1992 pp. 161-164.

Kouvetakis et al. "Novel Aspects of Graphite Intercalation by Fluorine and Fluorides and New B/C, C/N, and B/C/N Materials based on the Graphite Network" Synthetic Metals, 34 (1989) pp. 1-7.

Chemistry of Synthetic High Polymers, Chemical Abstracts, vol. 106, No. 24, Jun. 15, 1987, pp. 1 and 703.

*Primary Examiner*—Archene Turner
*Attorney, Agent, or Firm*—Hayes, Soloway, Hennessey, Grossman & Hage

[57] ABSTRACT

Carbonaceous material according to the invention is protected against oxidation by boron carbonitride, which is infiltrated (4) or deposited in layer form (8) and which contains in atomic %;

1 to 98% carbon,
1 to 98% boron and
1 to 98% nitrogen.

49 Claims, 1 Drawing Sheet

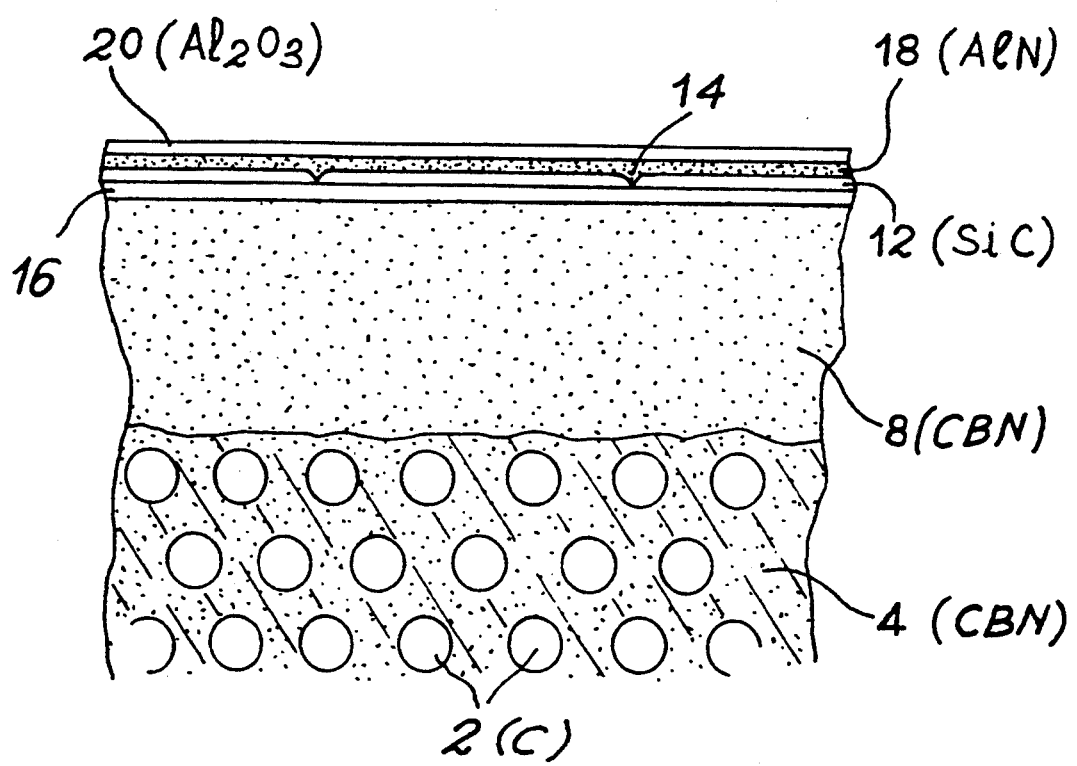

CARBONACEOUS MATERIAL PROTECTED AGAINST OXIDATION BY BORON CARBONITRIDE

This is a continuation of copending application Ser. No. 07/556,846 filed on Jul. 20, 1990, now abandoned.

DESCRIPTION

The present invention relates to carbonaceous materials made unoxidizable up to 2000° C. and for long periods (several hundred hours).

Such materials can be used in numerous industrial fields and in particular in the space field, where they are used for the high performance thermal protection for reusable space vehicles having to withstand heating effects caused by the friction of the air during their high speed reentry into the atmosphere. These space vehicles are in particular those whose reentry missions lead at certain points, which are more stressed than others such as nose cones, ailerons and leading edges, exposure to very high temperatures (from 1800° C. under an air pressure of 2.8 kPa to 2000° C. under 20 kPa) or lead to certain parts being exposed to variable temperatures (1000° to 1800° C.).

The invention is also applicable to other industrial fields requiring the use of parts able to withstand variable temperatures of 600° to 1500° C. for several hundred hours. This is in particular the case with improved efficiency jet engines operating at high temperatures, as well as certain industrial heat recuperators.

The carbonaceous materials protected against oxidation to which the invention applies are either carbon fibres arranged so as to form a fibrous substrate, or composite materials of the carbon-carbon type constituted in an appropriate manner by carbon fibres embedded in a carbon matrix, or so-called "solid" materials having no fibrous reinforcement.

One of the essential advantages of carbonaceous materials is that they retain their integrity up to 3000° and higher under rapid heating. Moreover, in the case of composite materials, there is an improvement to the mechanical characteristics from ambient temperature to 1500° C. and then a slow deterioration of these characteristics to 2000° C., where the mechanical characteristics are close to those of the ambient medium.

However, the major disadvantage of single or composite carbonaceous materials is that they significantly oxidize as from 400° C. in the presence of air. In order to avoid such oxidation, different processes have already been envisaged relating to the protection of carbonaceous materials and based on the use of halogens and halogen derivatives of carbon or compounds based on phosphorus, boron and silicon.

The first patent relating to the protection of carbonaceous materials against oxidation dates back to 1931 and is U.S. Pat. No. 1,948,382. The protection method described therein is based on a coating system having an internal silicon carbide coating and an external boric anhydride film. Glasses based on silica and phosphoric anhydride are also referred to in said patent.

This was followed by work on materials of the graphite type and then on carbon-carbon composites. Among the protection systems against the oxidation of carbon referred to in the literature, those which have given rise to a quantitative evaluation are phosphorus pentoxide ($P_2O_5$) boron trioxide ($B_2O_3$) and silicon carbide (SiC).

In the document by P. Magne et al "Etude cinetique de l'oxydation du graphite inhibée par les phosphates", Bull. Soc. Chim. France, No. 6, 1971, pp. 2005–2010, reference is made to a reduction in a ratio of 20 of the oxidation rate of graphite at 600° C. in dry air using phosphorus pentoxide. However, this anhydride reacts with carbon at about 1000° C. and this limit use temperature is lowered further in humid air due to the fact that $P_2O_5$ is very hygroscopic and the water reacts very quickly with the carbon.

The document by P. Ehrburger et al, "Inhibition of the oxydation of carbon-carbon composites by boron oxide", Carbon, vol. 24, No. 4, 1986, pp. 495–499 teaches that boron trioxide at 710° C. in dry air leads to a reduction in the carbon oxidation rate in a ratio of 50. However, this oxide starts to volatilize to a significant extent at about 800° C.

Although widely used, little basic information is available on the effectiveness of silicon carbide. However, for heating in air at temperatures below 1500° C., a carbon oxidation rate at least 100 times lower than that obtained in the absence of SiC, can be obtained with a proportion of SiC introduced into the material of approximately 30 volume %. However, the conventional carbonaceous materials and in particular high performance carbon-carbon composite materials, do not permit such a SiC incorporation level into the matrix, because they only have 6 to 10% by volume of porosity liable to be filled by the carbide.

In all the documents referred to hereinbefore, the protection of the carbonaceous material against oxidation is essentially obtained due to the production of an oxygen-impermeable, vitreous coating ($P_2O_5$, $B_2O_3$). In particular, SiC is covered with a silica film which is only very slightly permeable to oxygen as soon as it comes into contact with atmospheric oxygen.

Another way considered for the anti-oxidation protection of carbon consists of reducing the reactivity of the carbon with respect to oxygen by the addition of an inhibitor. It has long been known that an essential part is played in the oxidation mechanism of carbon atoms by "active sites", which would appear to be located in preferred manner on the so-called "edges" of the graphitic crystallites. The occupation of these sites by heteroatoms or molecules of a suitable type is able to reduce the carbon oxidation rate.

The inhibiting activity of $P_2O_5$ and $B_2O_3$ is partly due to this phenomenon and that of boron has recently been analysed. Thus, Jones and Thrower in the article "The effect of boron on carbon fiber microstructure and reactivity", J. Chim. Phys. 84, No. 11/12, 1987, pp. 1431–1438 have demonstrated that an incorporation of up to 5% boron into carbon significantly reduces its reactivity with respect to oxygen.

This effect can be explained both by the blocking of the active sites and by the surface covering of the carbon by an oxygen-impermeable boric oxide coating. It is also suggested in said article that, substituted for carbon and serving as an electron acceptor, the boron can reinforce the cohesion of the carbonaceous lattice with respect to the oxygen. Finally, as soon as the boron content exceeds 1% in the carbon, it stops fixing in substitution and the excess appears in the form of boron carbide.

Another document describing the incorporation of boron into carbonaceous materials for reducing their activity with respect hot oxygen, reference can be made to FR-A-2 569 684, which describes protection against oxidation obtained by chemical vapour phase deposition (CVD) of boron in carbonaceous materials for use below 1200° C. This relatively low use limitation temperature is intended to prevent a carbon-boron reaction, which starts beyond 1200° C. and for this reason reduces the mechanical resistance of the fibres of the carbon-carbon composites. These materials infiltrated by boron can also be covered by silicon carbide. U.S. Pat. Nos. 4,101,354 and 4,164,601 describe a process applicable to composite materials of the carbon-carbon type consisting of protecting the fibres against carbon-boron reaction by a carbon layer obtained from furfuryl alcohol copolymers. The following impregnations take place with resins containing varying quantities of amorphous boron and heated to 2150° C. This process remarkably improves the mechanical characteristics of the materials.

U.S. Pat. No. 3,672,936 describes a process making it possible to incorporate boron, boron nitride, boron silicide and borides of refractory metals in the solid state into fibrous reinforcements, prior to the impregnation by a carbonaceous material obtained from a resin.

Finally, FR-A-2 556 713 describes a process making it possible to incorporate boron alloyed to a varying extent with a refractory metal (W or Mo) into the carbonaceous matrix.

In order to obtain a high temperature protection, a description is also given of the use of a ceramic on the outer surface of the carbonaceous material. SiC and $Si_3N_4$ are the most appropriate ceramics, because they are refractory and compatible with the carbon. In addition, their expansion coefficients are very close to those of carbonaceous materials.

However, this latter property, particularly in the case of high performance carbon-carbon composite materials, does not prevent the appearance of cracking in the ceramic coating, so that the hot oxygen can reach the carbonaceous material and bring about its destruction.

Several solutions have already been proposed for filling these cracks. Most of them use glasses based on boron and silica. In particular, U.S. Pat. No. 4,613,522 describes a process making it possible to obtain a carbon-carbon composite material, whose densification matrix is obtained with a resin incorporating boron and boron carbide, the exterior of the part being covered with a silicon carbide layer. By heating in an oxidizing atmosphere, a borosilicate glass forms and stops up the cracks in the silicon carbide.

In U.S. Pat. No. 4,668,579, the protection principle is the same, but the boron carbide is obtained by chemical vapour deposition.

Finally, FR-A-2 611 198, filed in the name of the present applicant, describes a protection against the oxidation of carbon-carbon composites by covering fibres and infiltration of the matrix with silicon carbide and by creating on the surface of the part a SiC film made tight by a borosilicate glass.

Unfortunately, glasses containing boron trioxide can be hygroscopic or, due to the presence of oxygen, can cause chemical compatibility problems with the carbon and/or the outer SiC layer. This limits the life of the material in the case of long term exposure under oxidizing and/or humid conditions.

The invention specifically relates to a carbonaceous material protected against oxidation making it possible to obviate the various disadvantages referred to hereinbefore. In particular, it makes it possible to obtain a better protection of carbonaceous materials over a wide temperature range and which can even extend up to 2000° C. and for long periods, i.e. precisely where the prior art procedures were found to be inadequate.

This result is obtained by simultaneously using the two known protection procedures, namely the creation of an oxygen-impermeable surface layer and the reduction of the reactivity of the carbon with respect to oxygen.

The invention is based on the realisation of a novel refractory material based on boron, nitrogen and carbon and which can be infiltrated into the carbonaceous material to be protected and/or can be deposited in surface layer form.

This refractory material constitutes a true solid carbon-boron-nitrogen solution with a variable composition. Hereinafter this solid solution will be referred to as "boron carbonitride".

This solid solution can have variable compositions, ranging from almost pure carbon to almost pure boron nitride, as a function of the preparation conditions and the sought protection type. In addition, concentration gradients of these various constituents can be realized within the same carbonaceous material. Moreover, the boron carbonitride can be alloyed with oxygen and improve its protection properties.

More specifically, the invention relates to a carbonaceous material protected against oxidation by boron carbonitride containing in atomic %:

0 to 30% oxygen,
1 to 90% carbon,
1 to 98% boron and
1 to 98% nitrogen.

In particular, the boron carbonitride can contain in atomic %:

0 to 25% oxygen,
5 to 85% carbon,
10 to 50% boron and
5 to 50% nitrogen.

As a function of the operating conditions, in preferred manner the boron carbonitride has the following formula: $C_{0.64} B_{0.24} N_{0.12}$, or the following formula: $C_{0.30} B_{0.35} N_{0.35}$.

The boron carbonitride is designated hereinafter CBN when it does not contain oxygen and CBNO when it contains oxygen. The oxygen can be introduced during the preparation of the material or during its use in the presence of oxygen.

CBN or CBNO is particularly suitable for the protection of carbonaceous materials against oxidation. More particularly CBN is refractory and can withstand, without damage, temperatures of at least 1700° C. under a neutral atmosphere.

Moreover, the atomic composition of carbon, boron, nitrogen and oxygen can be adapted to needs. Thus, it is merely necessary to vary the production conditions and in particular the temperature, pressure and composition of the gases necessary for its synthesis in order to obtain, during the same operation, the desired composition variations.

In addition, CBN or CBNO is chemically compatible with carbon, In particular CBN does not react with carbon up to approximately 1900° C. Finally, the physical properties of CBN or CBNO can easily be adjusted in such a way as to make them compatible with those of the adjacent materials entering into the structure of the carbonaceous material, such as external ceramics (nitride, silicide, carbide, boride and oxide) and graphited or non-graphited carbons. Thus, the structure of the CBN or CBNO is essentially that of the boron nitride and its carbons.

It is in particular pointed out that boron nitride has a hexagonal crystalline form, whose lattice unit is almost identical to that of graphite. Furthermore, the expansion coefficients of hexagonal boron nitride and graphite are very similar.

The crystalline lattices of boron nitride and graphite also have an excellent behavioural compatibility at all temperatures. In particular, a quasi-perfect epitaxy of the boron nitride lattice onto the carbon lattice is obtained, thus leading to a strong adhesion of the boron nitride to the carbon, no matter what the thermal treatments involved. These crystalline compatabilities of carbon and boron nitride are retained, even when the boron nitride is "turbostratic".

The expansion coefficient of boron carbonitride can vary from $1.10^{-6}/K$ to $36.10^{-6}/K$, as a function of the orientation of the crystallites of the material, thus covering the behavioural differences of carbonaceous materials and ceramics. In particular, if the boron carbonitride has to be covered with an outer ceramic layer, such as a layer of SiC or $Si_3N_4$, its expansion coefficient is able to adapt both to that of the carbonaceous material and to that of the ceramic.

This adaptation of the expansion coefficient of the CBN or CBNO to that of the ceramic rarely leads to the appearance of cracking in the outer ceramic layer, contrary to what occurs in the prior art. However, if cracking should occur, the oxygen would stop at the surface of the boron carbonitride and form CBNO and essentially boron trioxide ($B_2O_3$) on its surface.

When the external ceramic used oxidizes on the surface, which is in particular the case with compounds containing silicon, such as SiC, the contacting of the boron trioxide and the oxide from the ceramic, e.g. silica, produces a glass and in particular a borosilicate glass, which heals the cracks of the ceramic layer (e.g. SiC).

The behaviour of the oxygen-free CBN in the presence of hot oxygen is closely dependent on its composition and crystalline structure. It only undergoes a negligible weight variation by heating to 900° C., part of the boron which it contains being transformed into oxide, which is not volatile under these conditions and which compensates the loss due to the partial oxidation of the carbon. The oxygen also has a tendency to fix and remain within the structure of the CBN rather than destroying it.

In addition, the carbonaceous material according to the invention can be protected from oxidation by carbonitride containing in atomic %:

5 to 25% oxygen,
5 to 80% carbon,
10 to 50% boron and
5 to 50% nitrogen.

The incorporation of oxygen into the CBN obviously modifies its properties, but all the oxygen, in case of need, can be eliminated by simply heating in an inert atmosphere at about 1700° C.

The boron carbonitride according to the invention can be produced as from 700° C. by CVD with an appropriate mixture of hydrocarbons, boron trichloride and ammonia, diluted in a carrier gas such as nitrogen or hydrogen, under a pressure of a few hundred to a few thousand pascals.

Varyingly substituted hydrocarbons usable according to the invention are chlorinated hydrocarbons such as $CHCl_3$ and $CCl_4$ and nitrated hydrocarbons. It is also possible to use an unsubstituted hydrocarbon such as acetylene.

The optimum temperature and pressure used for the vapour phase deposition of boron carbonitride must be adapted as a function of the hydrocarbon used. Moreover, if the production temperature increases, the carbon quantity increases in the CBN or CBNO.

The dilution of the gaseous mixture by hydrogen, although not necessary, improves the efficiency of the operation. In addition, the hydrogen changes with respect to the nitrogen, the reaction mechanism used in the gaseous phase leading to products of the same composition which are more structured (more crystallized) and not hygroscopic. Therefore they are more thermally stable and can withstand temperatures up to 2000° C.

As stated hereinbefore, the composition of the boron carbonitride according to the invention can be modified as a function of the sought properties and in particular the compatibility properties with the materials to come into contact with it. As a function of this composition, the structure or arrangement of the different boron carbonitride atoms obtained by CVD varies. A distinction should be made between the products containing more than 60 atomic % carbon and products containing less than 40 atomic % carbon.

In particular, the carbon-rich compounds have a crystalline structure, whereas the compounds containing less than 40 atomic % carbon are amorphous. It is possible to improve the crystallinity of the latter by annealing at 1700° C. under an inert atmosphere.

In addition, the products obtained usually contain a boron excess compared with the nitrogen. In other words, the B/N ratio is $\geq 1$ and more specifically between 1.01 and 2.

The composition of the boron carbonitride on or in the carbon can be adjusted by modifying the CVD conditions. In particular, it is possible to continuously vary said composition so as to obtain a concentration gradient for the carbon, boron and/or nitrogen. A progressive transition from pure carbon to pure boron nitride can also be obtained.

The boron carbonitride according to the invention can be used as an outer coating for the carbonaceous material or can be incorporated into the latter.

It can be used in several different ways, namely either by incorporating in the carbonaceous material (carbon, graphite, carbon fibre), or by depositing it on the carbonaceous material, e.g. by a progressive composition transition from pure carbon to carbonitride. It is also possible to cover the carbon-carbonitride assembly by an outer protective ceramic layer (e.g. SiC or $Si_3N_4$). The aforementioned use cases do not mutually exclude one another.

More specifically, the oxidation-protected, carbonaceous material according to the invention is a composite material having a fibrous or non-fibrous substrate of carbon or a refractory material embedded or not in a carbonaceous matrix. The matrix can be of pyrolytic carbon, graphitic carbon or vitreous carbon and may optionally contain 2 to 10% by weight SiC.

The composite carbon-boron carbonitride materials protected against oxidation by CBN can be placed in two categories, namely materials whose use temperature in an oxidizing atmosphere does not exceed 900° C. and materials whose use temperature in an oxidizing atmosphere can go up to 2000° C. with exposure times to said atmosphere of up to several hundred hours.

The materials of the first category are produced either with a mixed carbon-CBN or carbon-CBNO matrix in the form of mixtures or solid solutions of carbon and boron carbonitride, or with an infiltrated CBN or CBNO matrix, or with a CBN or CBNO deposit on carbonaceous materials, CBN or CBNO having a variable composition. Under these conditions, the protection against oxidation results from the blocking of the active sites of the carbon and the formation of a protective boron trioxide and/or CBNO film.

The materials of the second category can be obtained by covering a composite material based on carbon fibres embedded in a carbon matrix or any other composite material, with an outer coating of CBN or CBNO (with a possible concentration gradient) and an external ceramic layer (e.g. SiC, $Si_3N_4Al_2O_3$ or $ZrO_2$).

Under these conditions, the boron carbonitride blocks the active sites of the carbon and ensures a good interface between the carbon and the ceramic, whilst preventing cracking of the ceramic layer. The sealing of the ceramic prevents the penetration of the oxygen into the carbonaceous material.

Compared with the prior art, the boron carbonitride guarantees an increased security in the case of damage to the ceramic, whilst permitting the formation of a protective boron trioxide and/or CBNO film within the material. Moreover, when using SiC as the outer ceramic layer, the boron trioxide can be alloyed with the silicon oxide obtained at high temperature by the oxidation of SiC in order to give a "healing" glass filling possible ceramic cracks.

According to the invention, the outer ceramic coating can also be in two-layer form.

When silica is used as the outer ceramic, the latter is located towards the outside of the carbonaceous material or part and is preceded by a first layer such as of BN, TiN, $MoSi_2$, $TiB_2$, $ZrB_2$ or $HfB_2$ serving as a barrier.

When the outer ceramic is constituted by an oxide such as alumina, zirconia (stabilized) $HfO_2$ (stabilized), or a spinel of the type $Al_2O_3$—MgO—$Y_2O_3$, said oxide is located on the exterior of the part and can cover a first layer chosen from among compounds such as BN, AlN, $MoSi_2$, TiN, HfN, $W_2C$, WC, TaC, ZrC, HfC, $TiB_2$, $ZrB_2$, SiC or $Si_3N_4$, said first layer then serving as a barrier.

It is also possible to use a mixed carbon-CBN or carbon-CBNO matrix, covered by an outer CBN or CBNO covering, the latter being covered by an outer ceramic coating in single or two-layer form.

Other features and advantages of the invention can be gathered from the following non-limitative, illustrative description relative to the single attached drawing, which diagrammatically shows an embodiment of an oxidation-protected carbonaceous material according to the invention.

In the drawing, the carbonaceous material protected against oxidation in accordance with the invention is a composite material of the carbon-carbon type, having carbon reinforcing fibres 2, embedded in a pyrolytic carbon matrix. Following the densification of the carbon matrix, CBN is infiltrated into the carbon matrix by CVD, leading to the formation of a high carbon content CBN matrix 4. The gases used for this infiltration are $BCl_3$, $NH_3$ and $C_2H_2$ and the carrier gas is nitrogen. The infiltration temperature is >800° C.

Under similar conditions, deposition then takes place of an outer CBN layer 8, which contains approximately ⅓ carbon, ⅓ nitrogen and ⅓ boron, over a thickness of 10 to 500 micrometers as a function of the deposition time. In the case of a use beyond 900° C. of the carbonaceous material, an outer silicon carbide layer 12 is formed by CVD by the decomposition of one or more organosilanes which may or may not be substituted by a halogen, with which is optionally associated one or more gaseous hydrocarbons and/or hydrogen.

The organosilanes which can be used are in particular chlorosilanes of form $(CH_3)_n SiCl_{4-n}$ with $0<n<4$. Reference can e.g. be made to trichloromethyl silane, tetramethyl silane and dichlorodimethyl silane.

The hydrocarbons which can be used are in particular methane, ethane, propane and butane.

Preference is given to the use of the gaseous mixture containing hydrogen and trichloromethyl silane in a ratio of 4 to 12. However, other mixtures can be used, such as trichloromethyl silane in the presence of hydrogen (ratio close to 1) and butane (butane:trichloromethyl silane ratio 1 to 5) or trichloromethyl silane alone.

The preparation temperature (600° to 1000° C.) and pressure (5 to 100 hPa) are fixed so as to permit a regular deposit. The SiC thickness can vary from 2 to 10 micrometers.

In certain cases, cracks 14 form on the surface of the outer SiC layer during the use of said material, these cracks being due to the different expansion coefficients. Moreover, as soon as this material is used in the oxidizing atmosphere, these cracks 14 allow oxygen to penetrate into the protected material, thus leading to the formation of boron trioxide, which correctly wets the SiC and permits the formation of a healing glass 16, preventing any subsequent oxygen penetration into the CBN.

With a view to using the material at temperatures exceeding 1700° C. under a low pressure oxidizing atmosphere (typically below 33 kPa), it is necessary to cover the SiC layer 12 with an external two-layer coating. The latter e.g. has a layer 18 of aluminium nitride, molybdenum disilicide or hafnium nitride, with a thickness of 300 to 5000 nm and which is covered by a 2 to 100 micrometer thick alumina layer 20.

The AlN layer 18 is deposited by reduced pressure CVD (0.5 to 10 kPa) and/or with neutral gas scavenging. Deposition takes place by the decomposition of a mixture of aluminium chloride, hydrogen and ammonia.

The outer alumina layer 20 is also deposited by CVD in accordance with the following chemical reactions:

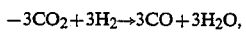

$$-3CO_2+3H_2\rightarrow 3CO+3H_2O,$$

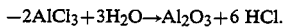

$$-2AlCl_3+3H_2O\rightarrow Al_2O_3+6\ HCl.$$

The parameters must be precisely regulated so as to obtain a very uniform, good adhering coating. Thus, use is e.g. made of a total pressure of 4 kPa, an aluminium chloride pressure of 0.1 kPa and a temperature of 1000° C.

The thickness of the alumina layer deposited varies from 2 to 100 micrometers as a function of the use conditions.

Although the invention is well adapted to the protection of composite materials of the carbon-carbon type, it is applicable to all carbonaceous materials. In particular, it can be applied to a material based on carbon and silicon carbide, which may or may not be composite, or based on carbon fibres.

EXAMPLE 1

This example relates to the production of a CBNO film containing less than 30 atomic % carbon deposited on the surface of a carbonaceous material by CVD under the following operating conditions:
pressure: 2.4 kPa,
temperature: 800° C.,
$BCl_3$ flow rate: 1.35 l/h,
$NH_3$ flow rate: 1.12 l/h,
$C_2H_2$ flow rate: 1.2 l/h,
$N_2$ flow rate: 1.2 l/h,
gaseous mixture velocity: 16 sm/sec in the reactor.

After 195 minutes deposition, a 150 micrometer thick film weighing 262 mg is obtained. The composition of the product obtained in atomic % is 35% boron, 31% nitrogen, 9% carbon and 25% oxygen.

EXAMPLE 2

In order to carry out a boron carbonitride infiltration into a carbon material use is made of conditions similar to those given in Example 1

EXAMPLE 3

In order to obtain a boron carbonitride containing approximately ⅓ carbon, ⅓ nitrogen and ⅓ boron and in particular a solid solution of formula $C_{0.30}B_{0.35}N_{0.35}$, deposited on the surface of a carbonaceous material or infiltrated into the same, use is made of the following CVD operating conditions:
temperature between 850° and 900° C.,
total pressure approximately 1.4 kPa,
$BCl_3/NH_3$ ratio between 1.1 and 2,
$C_2H_2/NH_3$ ratio equal to or above 1,
$N_2/C_2H_2$ ratio between 0 and 1.

The product obtained contains oxygen following exposure to air for a certain time. This oxygen can be eliminated by heating the product obtained at about 1700° C. in an inert atmosphere.

EXAMPLE 4

In order to obtain oxygen-free CBN in the form of a thin surface deposit of a carbonaceous or infiltrated material with a composition ⅓ carbon, ⅓ nitrogen and ⅓ boron, the proportions of the gases are varied within the limits of Example 3 and the gases are diluted in hydrogen instead of nitrogen. The deposition temperature can then be increased from 900° to more than 1000° C.

The thus obtained products still contain a boron excess compared with the nitrogen (B/N ratio 1.01 to 1.3) and can thus contain 10 to 40% carbon as a function of the operating conditions used. After being exposed to air for two months, the products obtained do not contain oxygen.

EXAMPLE 5

In order to obtain a carbonitride containing more than 70 atomic % carbon, use is made of the following operating conditions:
temperature approximately 1000° C., total pressure between 1.4 and 2.8 kPa,
$BCl_3/NH_3$ ratio close to 1.1,
$C_2H_2/NH_3$ ratio close to 1,
$N_2/C_2H_2$ ratio between 0 and 1.

The boron carbonitride deposit obtained contains oxygen following an exposure to air. It is possible to heat the product obtained to about 1700° C. in an argon or nitrogen atmosphere in order to eliminate the oxygen present in the material.

EXAMPLE 6

In order to obtain an oxygen-free CBN containing approximately 64C, 24% B and 12% N deposited on the surface and/or infiltrated into a carbonaceous porous material, the conditions must respect the following rules:
temperature between 1000° and 1100° C.,
total pressure 1.8 kPa,
$BCl_3/C_2H_2$ ratio above 1.2,
$C_2H_2/NH_3$ ratio above 2,
$BCl_3$ flow rate 1 l/h,
$C_2H_2$ flow rate 0.6 l/h,
dilution of gases in hydrogen in a proportion exceeding 8.

The velocity of the gases in the reactor must be approximately 1 m/sec.

After six hours deposition, a thin film with a metallic appearance is obtained, which has an approximate thickness of 50 micrometers and corresponding to the formula $C_5B_2N$ or $C_6B_2N$, as a function of the operating conditions. After two months exposure to air, the product has not incorporated oxygen.

We claim:

1. Carbonaceous material protected against oxygen at a temperature up to 2000° C., comprising an external coating in boron carbonitride and at least one outer ceramic layer covering said external coating, said external coating containing essentially a solid solution of carbon, boron and nitrogen, with an atomic %:

$C_{0.30}B_{0.35}N_{0.35}$.

2. Carbonaceous material protected against oxygen at a temperature up to 2000° C., comprising an external coating in boron carbonitride and at least one outer ceramic layer covering said external coating, said external coating containing essentially a solid solution of carbon, boron and nitrogen, with an atomic %:

$C_{0.64}B_{0.24}N_{0.12}$.

3. Carbonaceous material protected against oxygen at a temperature up to 2000° C., comprising an external coating in boron carbonitride and at least one outer ceramic layer covering said external coating, said external coating containing essentially a solid solution of carbon, boron and nitrogen, with an atomic %: $C_6B_2N$.

4. Carbonaceous material protected against oxygen at a temperature up to 2000° C., comprising an external coating in boron carbonitride and at least one outer ceramic layer covering said external coating, said external coating containing essentially a solid solution of carbon, boron and nitrogen, with an atomic %: $C_5B_2N$.

5. Material according to claim 1, wherein the outer ceramic layer is silicon carbide or silicon nitride.

6. Material according to claim 1, wherein a protective coating and/or healing glass is interposed between the external boron carbonitride coating and the outer ceramic layer.

7. Material according to claim 1, wherein the external boron carbonitride layer is covered with an outer two-layer ceramic coating.

8. Material according to claim 7, wherein the outer two-layer coating consists of a barrier layer of nitride, carbide, boride or silicide covered by an external oxide layer.

9. Material according to claim 1, wherein the outer ceramic layer is covered with a barrier layer of nitride, carbide, boride or silicide and then with an external oxide layer.

10. Carbonaceous composite material protected against oxygen according to claim 1, wherein said material comprises a carbonaceous substrate, infiltrated by boron carbonitride.

11. Material according to claim 1, wherein the boron carbonitride is obtained by chemical vapor deposition with a mixture of boron trichloride, ammonia and hydrocarbon, diluted in hydrogen.

12. Material according to claim 11, wherein the deposition of the boron carbonitride is effected from 700° C.

13. Material according to claim 11, wherein the deposition of the boron carbonitride is effected between 1000° and 1100° C.

14. Material according to claim 11, wherein the hydrocarbon is acetylene.

15. Material according to claim 2, wherein the outer ceramic layer is silicon carbide or silicon nitride.

16. Material according to claim 2, wherein a protective coating and/or healing glass is interposed between the external boron carbonitride coating and the outer ceramic layer.

17. Material according to claim 2, wherein the external boron carbonitride layer is covered with an outer two-layer ceramic coating.

18. Material according to claim 17, wherein the outer two-layer coating consists of a barrier layer of nitride, carbide, boride or silicide covered by an external oxide layer.

19. Material according to claim 2, wherein the outer ceramic layer is covered with a barrier layer of nitride, carbide, boride or silicide and then with an external oxide layer.

20. Carbonaceous composite material protected against oxygen according to claim 2, wherein said material comprises a carbonaceous substrate, infiltrated by boron carbonitride.

21. Material according to claim 2, wherein the boron carbonitride is obtained by chemical vapor deposition with a mixture of boron trichloride, ammonia and hydrocarbon, diluted in hydrogen.

22. Material according to claim 21, wherein the deposition of the boron carbonitride is effected between 1000° and 1100° C.

23. Material according to claim 21, wherein the hydrocarbon is acetylene.

24. Material according to claim 3, wherein the outer ceramic layer is silicon carbide or silicon nitride.

25. Material according to claim 3, wherein a protective coating and/or healing glass is interposed between the external boron carbonitride coating and the outer ceramic layer.

26. Material according to claim 3, wherein the external boron carbonitride layer is covered with an outer two-layer ceramic coating.

27. Material according to claim 26, wherein the outer two-layer coating consists of a barrier layer of nitride, carbide, boride or silicide covered by an external oxide layer.

28. Material according to claim 3, wherein the outer ceramic layer is covered with a barrier layer of nitride, carbide, boride or silicide and then with an external oxide layer.

29. Carbonaceous composite material protected against oxygen according to claim 3, wherein said material comprises a carbonaceous substrate, infiltrated by boron carbonitride.

30. Material according to claim 3, wherein the boron carbonitride is obtained by chemical vapor deposition with a mixture of boron trichloride, ammonia and hydrocarbon, diluted in hydrogen.

31. Material according to claim 30, wherein the deposition of the boron carbonitride is effected between 1000° and 1100° C.

32. Material according to claim 30, wherein the hydrocarbon is acetylene.

33. Material according to claim 4, wherein the outer ceramic layer is silicon carbide or silicon nitride.

34. Material according to claim 4, wherein a protective coating and/or healing glass is interposed between the external boron carbonitride coating and the outer ceramic layer.

35. Material according to claim 4, wherein the external boron carbonitride layer is covered with an outer two-layer ceramic coating.

36. Material according to claim 35, wherein the outer two-layer coating consists of a barrier layer of nitride, carbide, boride or silicide covered by an external oxide layer.

37. Material according to claim 4, wherein the outer ceramic layer is covered with a barrier layer of nitride, carbide, boride or silicide and then with an external oxide layer.

38. Carbonaceous composite material protected against oxygen according to claim 4, wherein said material comprises a carbonaceous substrate, infiltrated by boron carbonitride.

39. Material according to claim 4, wherein the boron carbonitride is obtained by chemical vapor deposition with a mixture of boron trichloride, ammonia and hydrocarbon, diluted in hydrogen.

40. Material according to claim 39, wherein the deposition of the boron carbonitride is effected between 1000° and 1100° C.

41. Material according to claim 39, wherein the hydrocarbon is acetylene.

42. Material according to claim 1, wherein the outer ceramic layer is silicon carbide.

43. Material according to claim 42, wherein the outer ceramic layer is silicon carbide.

44. Material according to claim 2, comprising a glass covering on the outer ceramic layer.

45. Material according to claim 44, wherein the outer ceramic layer is silicon carbide.

46. Material according to claim 3, comprising a glass covering on the outer ceramic layer.

47. Material according to claim 46, wherein the outer ceramic layer is silicon carbide.

48. Material according to claim 4, comprising a glass covering on the outer ceramic layer.

49. Material according to claim 48, wherein the outer ceramic layer is silicon carbide.

* * * * *

UNITED STATES PATENT AND TRADEMARK OFFICE
CERTIFICATE OF CORRECTION

PATENT NO. : 5,356,727
DATED : October 18, 1994
INVENTOR(S) : Yves GRENIE, Andre MARCHAND, and Frederic SAUGNAC It is certified that error appears in the above-indentified patent and that said Letters Patent is hereby corrected as shown below:

Claim 42, Col. 12, lines 48 and 49, "wherein the outer ceramic layer is silicon carbide" should be --comprising a glass covering on the outer ceramic layer--.

Signed and Sealed this

Twenty-first Day of March, 1995

Attest:

BRUCE LEHMAN

*Attesting Officer*     *Commissioner of Patents and Trademarks*